US009734753B2

(12) United States Patent
Li et al.

(10) Patent No.: US 9,734,753 B2
(45) Date of Patent: Aug. 15, 2017

(54) DATA ACQUISITION MODULE AND METHOD, DATA PROCESSING UNIT, DRIVER AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Mubing Li, Beijing (CN); Pengcheng Lu, Beijing (CN); Xue Dong, Beijing (CN); Renwei Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 71 days.

(21) Appl. No.: 14/894,923

(22) PCT Filed: May 19, 2015

(86) PCT No.: PCT/CN2015/079235
§ 371 (c)(1),
(2) Date: Nov. 30, 2015

(87) PCT Pub. No.: WO2016/107052
PCT Pub. Date: Jul. 7, 2016

(65) Prior Publication Data
US 2016/0358536 A1    Dec. 8, 2016

(30) Foreign Application Priority Data
Jan. 4, 2015  (CN) .......................... 2015 1 0002240

(51) Int. Cl.
*G06F 3/038*  (2013.01)
*G09G 3/20*  (2006.01)
(Continued)

(52) U.S. Cl.
CPC ............. *G09G 3/2096* (2013.01); *G09G 3/20* (2013.01); *G09G 3/2003* (2013.01); *G11C 19/00* (2013.01);
(Continued)

(58) Field of Classification Search
CPC .............................................. G09G 2310/0286
See application file for complete search history.

(56) References Cited

U.S. PATENT DOCUMENTS

2002/0021274 A1* 2/2002 Koyama ............... G09G 3/3266
345/98
2006/0023541 A1   2/2006 Sapre et al.
(Continued)

FOREIGN PATENT DOCUMENTS

CN   1324041    11/2001
CN   101751865   6/2010
(Continued)

*Primary Examiner* — Jennifer Mehmood
*Assistant Examiner* — Sosina Abebe
(74) *Attorney, Agent, or Firm* — Harness, Dickey & Pierce, P.L.C.

(57) ABSTRACT

The present invention provides a data acquiring module, comprising: a data input and output terminal, through which data enter into the data acquiring module, and which can output data independently; a shift register groups, each of which comprises (b−1) serially connected shift registers, and an output terminal of each shift register being able to output data independently, wherein a and b are integers greater than 1; and (a−1) serially connected first-in first-out memories connected to (a−1) shift register groups respectively, and the output terminal of each first-in first-out memory being able
(Continued)

to output data independently, an input terminal of the last shift register in the shift register group without a corresponding first-in first-out memory in the a shift register groups, and the input terminal of the last first-in first-out memory of the serially connected first-in first-out memories being connected to the data input and output terminal. The present invention also provides a data processing unit, a driver and a display device.

19 Claims, 5 Drawing Sheets

(51) Int. Cl.
  *G11C 19/00* (2006.01)
  *G11C 19/28* (2006.01)
(52) U.S. Cl.
  CPC ... *G11C 19/287* (2013.01); *G09G 2300/0452* (2013.01); *G09G 2310/0286* (2013.01); *G09G 2310/08* (2013.01); *G09G 2330/021* (2013.01)

(56) References Cited

U.S. PATENT DOCUMENTS

| | | | |
|---|---|---|---|
| 2006/0158466 A1* | 7/2006 | Chien | G09G 3/2074 345/694 |
| 2010/0177107 A1 | 7/2010 | Park et al. | |
| 2013/0215360 A1* | 8/2013 | Pollack | G02F 1/133621 349/61 |
| 2014/0250260 A1 | 9/2014 | Yap | |
| 2015/0255014 A1* | 9/2015 | Lin | G11C 19/28 345/84 |

FOREIGN PATENT DOCUMENTS

| | | |
|---|---|---|
| CN | 102077268 | 5/2011 |
| CN | 103092194 | 5/2013 |
| CN | 103631689 | 3/2014 |
| CN | 103886825 | 6/2014 |
| CN | 104036710 | 9/2014 |
| CN | 104537974 | 4/2015 |
| JP | 2000330536 | 11/2000 |

* cited by examiner

DATA ACQUISITION MODULE AND METHOD, DATA PROCESSING UNIT, DRIVER AND DISPLAY DEVICE

TECHNICAL FIELD

The present invention relates to the technical field of display, more particularly, to a data acquiring module, a data processing unit including the data acquiring module, a driver including the data processing unit, a display device including the driver, and a method for acquiring data by using the data acquiring module.

BACKGROUND OF THE INVENTION

In the current display panel, a pixel array comprises a plurality of pixels (or pixel cells), each pixel comprises a plurality of sub-pixels of different colors, and the illuminance and chrominance displayed by each pixel can be controlled by controlling the illuminance values of the sub-pixels of the different colors in the pixel.

FIG. 1 shows part of a pixel array in which each pixel cell comprises the sub-pixels of three colors of RGB. In order to get more clear display effect, usually it is needed to add the number of pixels in a unit area in the pixel array, and this on one hand increases the process difficulty, and on the other hand, causes larger power consumption.

In order to solve the above problem, in the prior art a pixel array arranged in a staggered structure is proposed, and thus the spatial filtering method needs to be used to calculate the actual illuminance value of each of the actual sub-pixels. When the spatial filtering method is executed, the theoretical illuminance values of a plurality of theoretical sub-pixels need to be acquired at the same time, and then the acquired theoretical illuminance values of the plurality of theoretical sub-pixels are used for calculation to obtain the actual illuminance value of the actual sub-pixel.

Generally, the theoretical illuminance values of a plurality of theoretical sub-pixels are acquired at the same time by way of software programming, so that the time required for calculation is increased and data processing efficiency is reduced. Therefore, it is an urgent technical problem that needs to be solved in the art to improve the execution efficiency of the spatial filtering method.

SUMMARY

The present invention provides a data acquiring module, a data processing unit comprising the data acquiring module, a driver comprising the data processing unit and a display device comprising the driver, and a method for acquiring data by using the data acquiring module. The data acquiring module is implemented in hardware, and it can rapidly acquire the illuminance values of a plurality of theoretical sub-pixels, improving the execution efficiency of the spatial filtering method.

According to an aspect of the present invention, there is provided a data acquiring module, comprising: a data input and output terminal, through which data enter into the data acquiring module, and which can output data independently; a shift register groups, each of which comprises (b−1) serially connected shift registers, an output terminal of each shift register being able to output data independently, wherein a and b are integers greater than 1; and (a−1) serially connected first-in first-out memories corresponding to (a−1) shift register groups respectively, an output terminal of each of the first-in first-out memories being connected to the input terminal of the last shift register in the corresponding shift register group, and the output terminal of each of the first-in first-out memories being able to output data independently; an input terminal of the last shift register in the shift register group without a corresponding first-in first-out memory in the a shift register groups, and an input terminal of the last first-in first-out memory in the (a−1) serially connected first-in first-out memories being connected to the data input and output terminal.

According to another aspect of the present invention, there is provided a data processing unit for driving a pixel array, and the pixel array comprising m rows×n columns of actual pixels, each actual pixel comprising a plurality of actual sub-pixels with mutually different colors. The data processing unit comprises: a first memory; a sub-pixel renderer, an enable signal generator and a second memory. The first memory is for storing illuminance values of the theoretical sub-pixels of each theoretical pixel of a theoretical pixel array of an image to be displayed, the theoretical pixel array of the image to be displayed comprising M rows×N columns of theoretical pixels, wherein N>n, M≥m. The sub-pixel renderer comprises: the data acquiring module according to the present invention, which acquires illuminance values of a×b theoretical sub-pixels corresponding to an actual sub-pixel to be calculated from the first memory, and outputs the acquired illuminance values of the a×b theoretical sub-pixels simultaneously through the data input and output terminal, the first-in first-out memories and each of the shift registers in the shift register groups; a calculation module, which uses the illuminance value of each theoretical sub-pixel in the illuminance values of the a×b theoretical sub-pixels output by the data acquiring module to calculate an illuminance value of the actual sub-pixel; and an actual illuminance signal generator, which generates an actual illuminance signal according to the illuminance value of the actual sub-pixel calculated by the calculation module. After receiving a start timing signal, the enable signal generator sends an enable signal to the first-in first-out memory of the data acquiring module storing the data, to make the first-in first-out memory to read out the data. The second memory is used to store the actual illuminance signal generated by the actual illuminance signal generator.

According to an embodiment of the present invention, the calculation module may comprise: a×b multipliers, which respectively receive the illuminance values of a×b theoretical sub-pixels output by the data acquiring module, and in each of which, the received illuminance value of a theoretical sub-pixels is multiplied with a corresponding filtering coefficient; an adder, which sums the a×b products obtained by the a×b multipliers; and a conversion module, for converting the sum obtained by the adder into an actual illuminance value of the actual sub-pixel.

According to an embodiment of the present invention, the data processing unit further comprises: an edge processor for supplementing with virtual pixels of which the illuminance values of the respective sub-pixels are all 0s at the outside of the first row and the last row as well as at the outside of the first column and the last column of the image to be displayed, to form a virtual pixel array corresponding to the theoretical pixel array of the image to be displayed. The first memory receives and stores the illuminance values of the respective sub-pixels of each pixel of the virtual pixel array.

According to an embodiment of the present invention, the filtering coefficient may be a product of the initial coefficient and $2^{16}$, and the sum of the initial coefficients is 1; moreover, the conversion module may comprise a shift unit for dividing the sum obtained by the adder by $2^{16}$, so as to get an illuminance value of the actual sub-pixel.

According to the embodiment of the present invention, a=3, b=3; and the filtering coefficients corresponding to the first row of theoretical sub-pixels are 459, 7733, and 0 respectively, and the filtering coefficients corresponding to the second row of theoretical sub-pixels are 13631, 31850 and 3670 respectively, and the filtering coefficients corresponding to the third row of theoretical sub-pixels are 459, 7733, and 0 respectively.

In another aspect of the present invention, there is provided a driver for driving a pixel array, comprising: an signal input interface for receiving illuminance values of the theoretical sub-pixels of each theoretical pixel of a theoretical pixel array of an image to be displayed; the data processing unit of the present invention; an output interface for outputting the actual illuminance signals stored in the second memory of the data processing unit to the pixel array; and a timing control unit for controlling data input and output timing of the data acquiring module of the sub-pixel renderer of the data processing unit. After the first group of b pieces of data have been transmitted to the data input and output terminal of the data acquiring module, the timing control unit sends a timing start signal each time when a group of b pieces of data are transmitted subsequently, so as to make the enable signal generator of the data processing unit to send an enable signal to the first-in first-out memories of the data acquiring module storing the data, and to make the first-in first-out memories to read out the data; and, after the first (b−1) pieces of data of the $a^{th}$ group of data have been transmitted to the respective shift registers of the $a^{th}$ shift register group of the data acquiring module, the timing control unit sends a timing end signal, to make the data input and output terminal of the data acquiring module, the respective first-in first-out memories and each shift registers in the respective shift register groups to output the data simultaneously.

According to another aspect of the present invention, there is provided a display device, which comprises a pixel array and the driver for driving a pixel array of the present invention. The pixel array comprises a plurality of pixels, each pixel comprising three sub-pixels of different colors, and the aspect ratio of the sub-pixels is between 2:3 to 1:1.

According to another aspect of the present invention, there is provided a method for acquiring data by using the data acquiring module of the present invention, comprising: after a first group of b pieces of data have been transmitted to the data input and output terminal of the data acquiring module, each time when a group of b pieces of data are transmitted in, making the first-in first-out memories of the data acquiring module to read out the data; and after the first (b−1) pieces of data of the $a^{th}$ group of data have been transmitted to the respective shift registers of the $a^{th}$ shift register group of the data acquiring module, making the data input and output terminal of the data acquiring module, the respective first-in first-out memories and each shift register in the respective shift register groups to output data simultaneously.

The data acquiring module provided by the present invention is a hardware device, and its calculation speed is higher than that of software. Therefore, using the data acquiring module provided by the present invention can rapidly acquire data. Thus it can be seen that using the data acquiring module provided by the present invention can improve the execution efficiency of the spatial filtering method.

BRIEF DESCRIPTION OF THE ACCOMPANYING DRAWINGS

The accompanying drawings are used to provide further understanding of the present invention, and constitute part of the specification to interpret the present invention in conjunction with the following specific embodiments, but do not form restriction to the present invention.

FIGS. 5-7 show schematic diagrams of various virtual pixel arrays;

DETAILED DESCRIPTION OF EXEMPLARY EMBODIMENTS

In the following specific implementations of the present invention will be described in detail in conjunction with the accompanying drawings. It should be understood that the specific implementations described here are merely to explain and interpret the present invention, and do not restrict the present invention.

Figure 1:
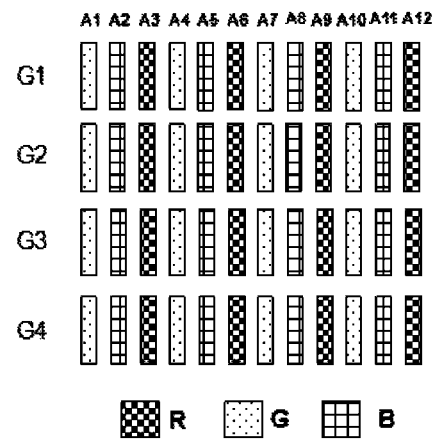
FIG. 1 shows part of a pixel array in which each pixel cell comprises sub-pixels of three colors of RGB.
Figure 2:
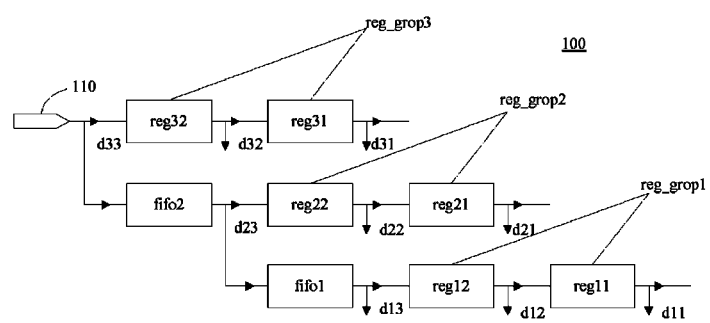
FIG. 2 is a structural schematic diagram of a circuit of a data acquiring module according to an embodiment of the present invention.
Figure 3:
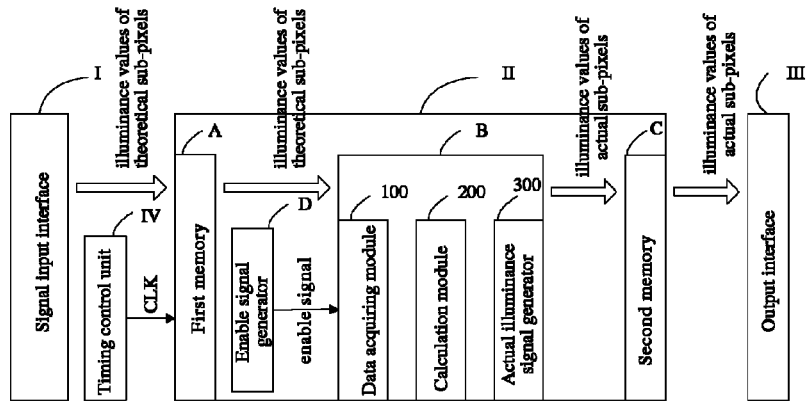
FIG. 3 is a structural schematic diagram of a driver for driving a pixel array according to an embodiment of the present invention.

FIG. 2 is a structural schematic diagram of a circuit of a data acquiring module according to an embodiment of the present invention. FIG. 3 is a structural schematic diagram of a driver for driving a pixel array, which includes the data acquiring module 100 shown in FIG. 2.

As shown in FIG. 2, the data acquiring module according to an embodiment of the present invention comprises: a data input and output terminal 110, through which data enters into the data acquiring module, and which can independently output data; a shift register groups (FIG. 2 shows 3 shift register groups, i.e., a=3), each of which comprises (b−1) shift registers (FIG. 2 shows that each shift register group comprises 2 shift registers, i.e., b=3), the output terminal of each shift register being able to output data independently; and (a−1) serially connected first-in first-out (FIFO) memories (2 FIFO memories shown in FIG. 2), corresponding to the (a−1) shift register groups respectively, wherein the output terminal of each FIFO memory is connected to the input terminal of the last shift register in the corresponding shift register group, and the output terminal of each FIFO memory can independently output data. In addition, the input terminal of the last shift register in the shift register group without a corresponding FIFO memory in the a shift register groups, and the input terminal of the last FIFO memory in the (a−1) serially connected FIFO memories, are connected to the data input and output terminal.

As shown in FIG. 2, each shift register group in the 3 shift register groups, reg_grop1, reg_grop2 and reg_grop3, comprises 2 shift registers. Shift register group reg_grop1 comprises shift registers reg11 and reg12, shift register group reg_grop2 comprises shift registers reg21 and reg22, and shift register group reg_grop3 comprises shift registers reg31 and reg32. In addition, 2 serially connected FIFO memories fifo1 and fifo2 are connected to the last shift register reg12 in the shift register group reg_grop1 and the last shift register reg22 in the shift register group reg_grop2.

As shown in FIG. 3, the driver for driving a pixel array according to an embodiment of the present invention comprises: a signal input interface I for receiving illuminance values of the theoretical sub-pixels of each theoretical pixel of a theoretical pixel array of an image to be displayed; a data processing unit II; an output interface III for outputting the actual illuminance signals stored in the second memory C of the data processing unit II to the pixel array; and a timing control unit IV for controlling the timing of data input and output of the data acquiring module 100 of the sub-pixel renderer B of the data processing unit II.

Data processing unit II is for driving a pixel array of m rows×n columns of actual pixels, and each actual pixel comprises a plurality of actual sub-pixels with mutually different colors. As shown in FIG. 3, the data processing unit II comprises a first memory A, a sub-pixel renderer B, a second memory C and an enable signal generator D.

The first memory A is for storing illuminance values of the theoretical sub-pixels of each theoretical pixel of a theoretical pixel array of the image to be displayed, and the theoretical pixel array of the image to be displayed comprise M rows×N columns of theoretical pixels, wherein N>n and M≥m The sub-pixel renderer B comprises a data acquiring module 100, a calculation module 200 and an actual illuminance signal generator 300 shown in FIG. 2. The data acquiring module 100 obtains the illuminance values of a×b theoretical sub-pixels corresponding to an actual sub-pixel to be calculated from the first memory A, and outputs the acquired illuminance values of a×b theoretical sub-pixels simultaneously through the data input and output terminal 110, the FIFO memories fifo1 and fifo2 and each shift register in the shift register groups (reg_grop1 to reg_grop3). The calculation module 200 uses the illuminance value of each theoretical sub-pixel in the illuminance values of a×b theoretical sub-pixels output by the data acquiring module 100 to calculate the illuminance value of the actual sub-pixel. The actual illuminance signal generator 300 generates an actual illuminance signal according to the illuminance value of the actual sub-pixel calculated by the calculation module 200.

The second memory C is for storing the actual illuminance signal generated by the actual illuminance signal generator 300.

The timing control unit IV may send a timing signal CLK, which comprises a timing start signal and a timing end signal.

When calculating the illuminance value of an actual sub-pixel, the data acquiring module 100 needs to acquire the illuminance values of a×b theoretical sub-pixels corresponding to the actual sub-pixels to be calculated from the first memory A. After the first group of b pieces of data (i.e., the illuminance values of the b theoretical sub-pixels) have been transmitted into the data input and output terminal 110 of the data acquiring module 100, the timing control unit IV sends a timing start signal each time when a group of b pieces of data are transmitted in subsequently, so as to make the enable signal generator D of the data processing unit II to send an enable signal to the FIFO memories of the data acquiring module 100 storing the data, and to make the FIFO memories to read out the data; moreover, after the first (b−1) pieces of data of the $a^{th}$ group of data have been transmitted to the respective shift registers (e.g., reg31 and reg32) of the $a^{th}$ shift register group (e.g., reg_grop3) of the data acquiring module 100, the timing control unit IV sends a timing end signal, so that the data input and output terminal 110 of the data acquiring module 100, the respective FIFO memories fifo1 and fifo2 and each shift register in the respective shift register groups (reg_grop1 to reg_grop3) to output the data simultaneously.

After receiving the start timing signal sent by the timing control unit IV, the enable signal generator D sends an enable signal to the FIFO memories of the data acquiring module 100 storing the data, to make the FIFO memories to read out the data.

According to an embodiment of the present invention, there is provided a method for acquiring data by using the data acquiring module 100 according to the above embodiment of the present invention, comprising: after a first group of b pieces of data have been transmitted to the data input and output terminal of the data acquiring module 100, each time when a group of b pieces of data are transmitted in, the first-in first-out memories of the data acquiring module 100 read out the data; and after the first (b−1) pieces of data of the $a^{th}$ group of data have been transmitted to the respective shift registers of the $a^{th}$ shift register group of the data acquiring module 100, the data input and output terminal of the data acquiring module 100, the respective first-in first-out memories and each shift register in the respective shift register groups output the data simultaneously.

In the following, the working principles of the data acquiring module 100 according to an embodiment of the present invention will be further described in detail by referring to FIG. 2. In the embodiment shown in FIG. 2, when the illuminance value of an actual sub-pixel is calculated, the data acquiring module 100 needs to acquire the illuminance values of the 3×3 theoretical sub-pixels corresponding to the actual sub-pixel to be calculated.

When the first group of 3 pieces of data (d11, d12 and d13) are transmitted into the data acquiring module 100 through the data input and output terminal 110, the timing control unit IV does not send the timing start signal. At this time, the first group of 3 pieces of data are stored in the last FIFO memory of the 2 serially connected FIFO memories, i.e., in the FIFO memory fifo2.

When the second group of 3 pieces of data (d21, d22 and d23) enter into the data acquiring module 100 through the data input and output terminal 110, the timing control unit IV sends the first timing start signal to the enable signal generator D. After the enable signal generator D has received the first timing start signal, it sends an enable signal to the FIFO memory fifo2. After the FIFO memory fifo2 has received the enable signal, it reads out the group of 3 pieces of data (d11, d12 and d13) stored therein to the serially connected preceding FIFO memory, i.e., the FIFO memory fifo1, and meanwhile stores a second group of 3 pieces of data (d21, d22 and d23) into the FIFO memory fifo2.

In the same way, when the third group of 3 pieces of data (i.e., the last group of 3 pieces of data) (d31, d32 and d33) enter into the data acquiring module 100 through the data input and output terminal 110, the 2 serially connected FIFO memories fifo1 and fifo2 both store a group of 3 pieces of data. At this time, the timing control unit IV sends the last timing start signal. After the enable signal generator D has received the last timing start signal, it sends enable signals to the FIFO memories fifo1 and fifo2. The FIFO memories fifo1 and fifo2 start to output data to the respective shift registers in the shift register groups reg_grop1 and reg_grop2 connected thereto. In addition, 2 pieces of data (d31 and d32) in the $3^{rd}$ group of 3 pieces of data (d31, d32, and d33) are also input to the respective shift registers reg31 and reg32 of the $3^{rd}$ shift register group reg_grop3.

In each group of 3 pieces of data, the first data (e.g., d11) arrives at the first shift register (e.g., reg11) in the shift register group including 2 shift registers after two delays. In addition, in the corresponding FIFO memory (e.g., fifo1), there is still stored the last piece of data (e.g., d13) in the group of 3 pieces of data. At this time, the timing control unit IV sends a timing end signal, to make the data input and output terminal 110 of the data acquiring module 100, the FIFO memories fifo1 and fifo2 and each shift registers in the shift register groups reg_grop1 and reg_grop3 to output data simultaneously. Thus, 3×3 pieces of data can be output simultaneously.

The data acquiring module 100 according to an embodiment of the present invention is a hardware device, with a faster calculation speed than that of software. Therefore, the data acquiring module 100 according to an embodiment of the present invention may be used to acquire a×b (e.g., 3×3) pieces of data rapidly.

Figure 4:
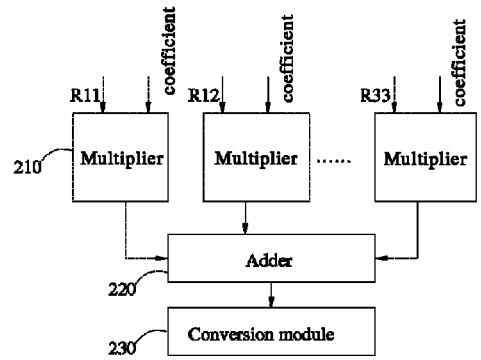
FIG. 4 is a structural schematic diagram of a calculation module shown in FIG. 3.

FIG. 4 is a structural schematic diagram of the calculation module 200 shown in FIG. 3. The present invention does not limit the specific structure of the calculation module 200, and the structure of the calculation module shown in FIG. 4 is merely an exemplary embodiment.

Referring to FIGS. 3 and 4, the calculation module 200 comprises a×b multipliers 210, which receive respectively the illuminance values of a×b theoretical sub-pixels output by the data acquiring module 100, and in each of which, the received illuminance value of the theoretical sub-pixel is multiplied with the corresponding filtering coefficient. In addition, the calculation module 200 further comprises an adder 220 and a conversion module 230. The adder 220 is for summing the a×b products obtained by the a×b multipliers 310, and the conversion module 220 is for converting the sum obtained by the adder 220 to the actual illuminance value of the actual sub-pixel.

In the implementation shown in FIG. 4, the products of 9 red theoretical sub-pixels and the corresponding filtering coefficients are calculated simultaneously, and the sum of the 9 products is calculated. R11 denotes the illuminance value of the red theoretical sub-pixel corresponding to the data d11 (see FIG. 2). In the same way, R33 denotes the illuminance value of the red theoretical sub-pixel corresponding to the data d33 (see FIG. 2).

In the spatial filtering method, the actual illuminance value of an actual sub-pixel is the sum of part of the illuminance value of the theoretical sub-pixel corresponding to the actual sub-pixel in position and part of the illuminance values of the theoretical sub-pixels around the theoretical sub-pixel. As for "part of the illuminance value of the theoretical sub-pixel", it may be obtained by multiplying the "illuminance value of the theoretical sub-pixel" by an initial coefficient smaller than 1. And the sum of the initial coefficients corresponding to the respective "illuminance values of the theoretical sub-pixels" is 1.

The present invention does not limit the filtering coefficients used in calculation in the multiplier 210. It is easy to understand that since the multiplier can only perform calculation on integers, the filtering coefficients should be integers. According to an embodiment of the present invention, a shift operation may be performed on the initial coefficients used in the spatial filtering method to obtain the respective filtering coefficients. For example, an initial coefficient may be multiplied by $2^{16}$, to ensure that the obtained filtering coefficient is an integer. Therefore, the function of the conversion module 230 is to shift further the sum calculated by the added 220. For example, the function of the conversion module 230 is to divide the sum output by the adder 220 by $2^{16}$.

In order to calculate the actual illuminance values of the actual sub-pixels at the edges, the data processing unit II also comprises an edge processor (not shown in the drawing), for supplementing with virtual pixels of which the illuminance values of the respective sub-pixels are all 0s at the outside of the first row and the last row as well as at the outside of the first column and the last column of the image to be displayed, to form a virtual pixel array corresponding to the theoretical pixel array of the image to be displayed. The first memory receives and stores the illuminance values of the sub-pixels of each pixel of the virtual pixel array.

Figures 5, 6, 7:
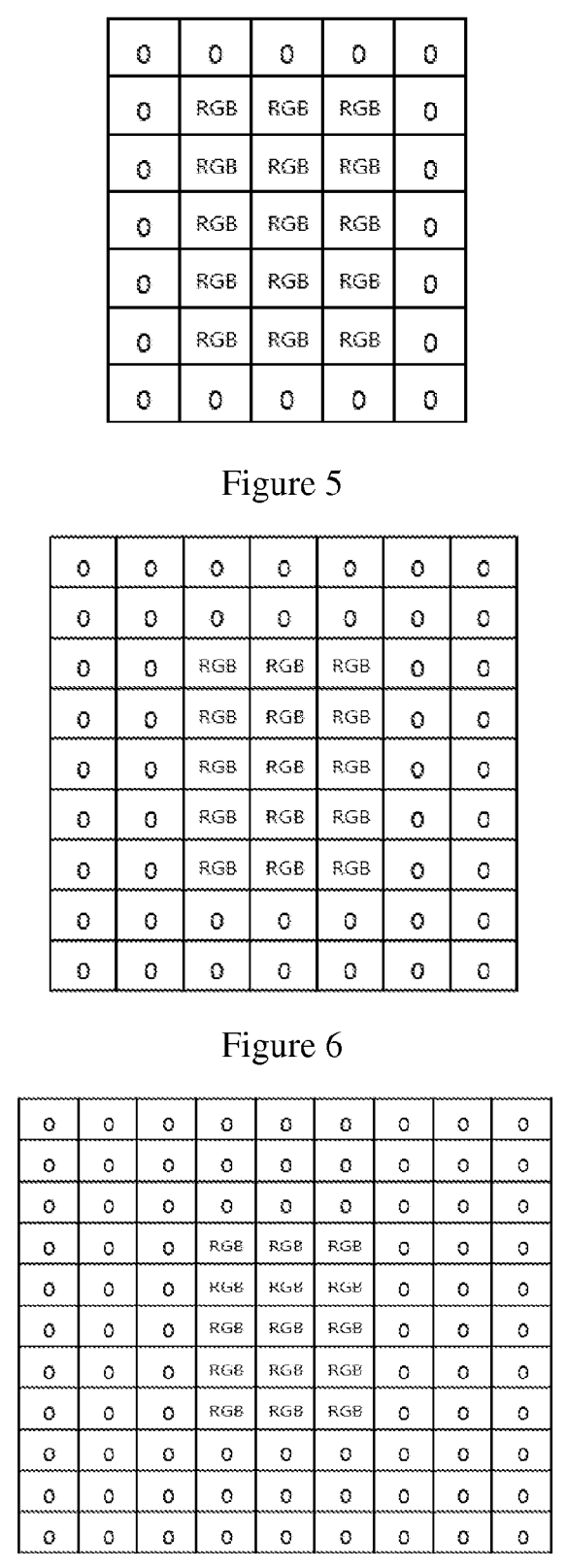

FIGS. 5 to 7 show schematic diagrams of various virtual pixel arrays. FIG. 5 shows a schematic diagram of a virtual pixel array obtained by using the edge processor when a=3; FIG. 6 shows a schematic diagram of a virtual pixel array obtained by the edge processor when a=5; and FIG. 7 shows a schematic diagram of a virtual pixel array obtained by using the edge processor when a=9.

The data processing unit II comprising the data acquiring module 100 according to an embodiment of the present invention is suitable to process the illuminance signals of the sub-pixels of the image to be displayed by using the spatial filtering method.

The plurality (a×b) of theoretical sub-pixels for calculating the actual illuminance value of an actual sub-pixel comprise the theoretical sub-pixel of the same color corresponding to the actual sub-pixel in position, and the [(a×b)−1] theoretical sub-pixels of the same color around the theoretical sub-pixel.

According to a preferred embodiment of the present invention, a=b=3, and the filtering coefficients corresponding to the first row of 3 theoretical sub-pixels are 459, 7733, and 0 respectively; the filtering coefficients corresponding to the second row of 3 theoretical sub-pixels are 13631, 31850, and 3670 respectively; and the filtering coefficients corresponding to the third row of 3 theoretical coefficients are 459, 7733, and 0 respectively.

As described previously, the filtering coefficient is the product of the initial coefficient and $2^{16}$. Therefore, the initial coefficients of the first row of 3 theoretical sub-pixels are 0.007, 0.118, and 0, respectively; the initial coefficients of the second row of 3 theoretical sub-pixels are 0.208, 0.786, and 0.056, respectively; and the initial coefficients of the third row of 3 theoretical sub-pixels are 0.007, 0.118, and 0, respectively. The sum of all the initial coefficients is 1. Correspondingly, the conversion module 230 may comprise a shift unit for dividing the sum obtained by the adder 220 by $2^{16}$, so as to get the illuminance value of the actual sub-pixel.

In the following a method for driving a pixel array by using the spatial filtering method will be described. The method for driving a pixel array according to an embodiment of the present invention comprises the steps of:

obtaining the illuminance values of the theoretical sub-pixels of each theoretic pixel in the image to be displayed (executed by the first memory A shown in FIG. 3);

calculating the actual illuminance values of the actual sub-pixels (executed by the sub-pixel renderer B shown in FIG. 3); and driving the corresponding actual sub-pixels in the pixel array by using the calculated actual illuminance values.

The step of calculating the actual illuminance values of the actual sub-pixels comprise:

obtaining theoretical gray scale signal values of the plurality of theoretical sub-pixels corresponding to an actual sub-pixel to be calculated (executed by the data acquiring module 100 shown in FIG. 3);

calculating a gray scale signal value of the actual sub-pixel by using the obtained gray scale signal value of each theoretical sub-pixel in the plurality of theoretical sub-pixels corresponding to the actual sub-pixel to be calculated (executed by the calculation module 200 shown in FIG. 3); and generating an actual illuminance signal corresponding to the calculated illuminance value of the actual sub-pixel (executed by the actual illuminance signal generator 300 shown in FIG. 3).

Driving the pixel array using the spatial filtering method can make the displayed image to have the display effect of higher resolution in the same size. Since the present invention uses hardware (i.e., the data acquiring module 100) to acquire the illuminance values of the plurality of theoretical sub-pixels used in the spatial filtering method, the driving method provided by the present invention has short time consumption and high efficiency, so that it can increase the reaction speed of the display device comprising the pixel array according to the present invention.

According to an embodiment of the present invention, the data processing unit II is integrated in the same FPGA.

Figure 8:
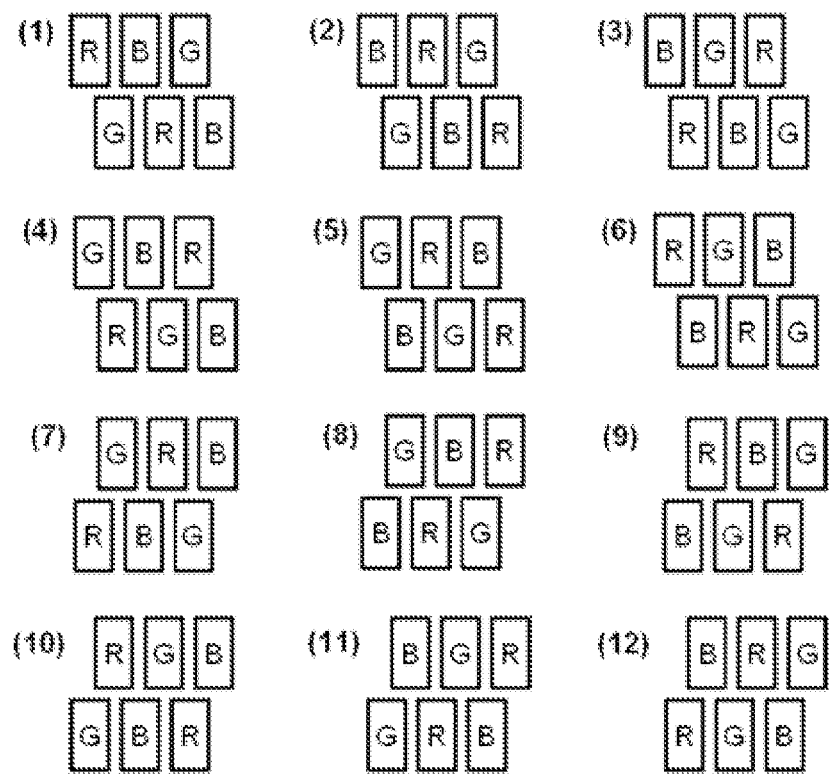
FIG. 8 shows various arrangements of the sub-pixels of a pixel array that can be driven by using the driver according to an embodiment of the FIG. 9 shows theoretical sub-pixels and actual sub-pixels with an aspect ratio of 2:3.
Figure 9:
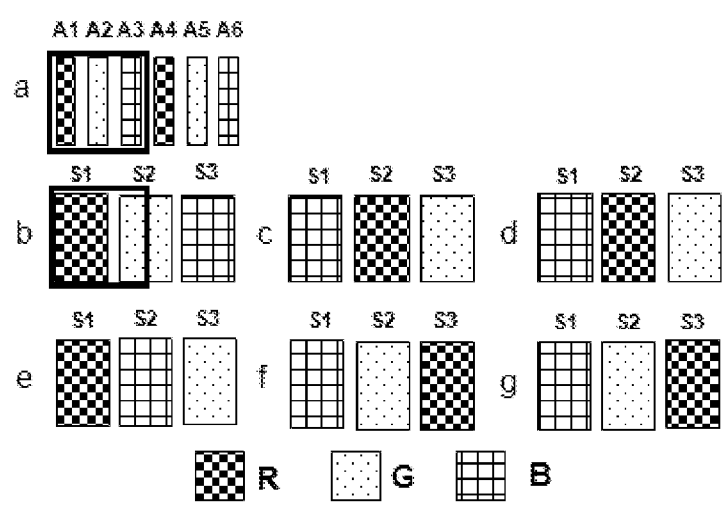
Figure 10:
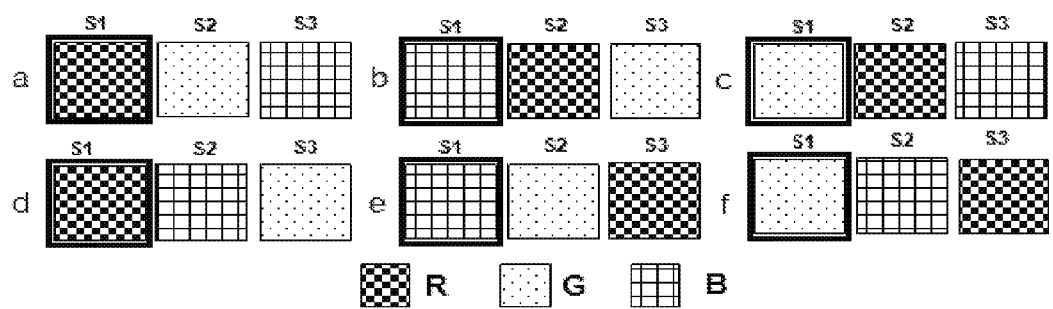
FIG. 10 shows theoretical sub-pixels and actual sub-pixels with an aspect ratio of 1:1.

FIGS. 8 to 10 show various arrangements of the sub-pixels of a pixel array that can be driven using the driver according to an embodiment of the present invention.

In the arrangement shown in FIG. 8, the actual sub-pixels in a pixel array are arranged in a staggered structure. Specifically, the second row of actual sub-pixels are staggered by half of an actual sub-pixel from the first row of actual sub-pixels.

In a pixel array for which the present invention is applicable, the size of each actual sub-pixel is larger than the size of each theoretical sub-pixel. According to an exemplary embodiment, the aspect ratio of each actual sub-pixel is 2:3 (shown in b to g in FIG. 4) to 1:1 (shown in FIG. 5), and the aspect ratio of each theoretical sub-pixel is 1:3 (shown in a in FIG. 4) or 1:4. Since the size of the actual sub-pixels is large, they are relatively easy to manufacture.

Using the data processing unit II according to an embodiment of the present invention can rapidly execute the spatial filtering method, so as to reduce the time required to drive the pixel array, and improve the reaction speed of the display device.

According to an embodiment of the present invention, the output interface III comprises a mobile industry processor interface (i.e., DVI interface), and the signal input interface I comprises a digital video interface (i.e., MIPI interface).

The driver for driving a pixel array according to the present invention may be applied in a display device comprising a pixel array. The pixel array comprises a plurality of pixels, each pixel may comprise three sub-pixels of different colors, and the aspect ratio of the sub-pixels is between 2:3 to 1:1.

The display device may be an electronic device such as a television, computer, mobile phone and tablet computer.

It is easy to understand that the data acquiring module and the method for acquiring data provided by the present invention are not limited to the display field, and can also be applied in other fields where acquiring data is needed.

It may be understood that the above implementations are merely exemplary implementations used to explain the principles of the present invention, and the present invention is not limited to this. To those of ordinary skill in the art, various variations and improvements may be made without departing from the spirit and essence of the present invention, and these variations and improvements are also viewed as within the protection scope of the present invention.

The invention claimed is:

1. A data acquiring module, comprising:
a data input and output terminal, through which data enter into the data acquiring module, and which can output data independently;
a shift register groups, each of which comprises (b−1) serially connected shift registers, an output terminal of each shift register being able to output data independently, wherein a and b are integers greater than 1; and
(a−1) serially connected first-in first-out memory corresponding to (a−1) shift register groups respectively, an output terminal of each of the first-in first-out memories being connected to the input terminal of the last shift register in the corresponding shift register group, and the output terminal of each of the first-in first-out memories being able to output data independently;
an input terminal of the last shift register in the shift register group without a corresponding first-in first-out memory in the a shift register groups, and an input terminal of the last first-in first-out memory in the (a−1) serially connected first-in first-out memories being connected to the data input and output terminal.

2. A data processing unit for driving a pixel array, the pixel array comprising m rows×n columns of actual pixels, each actual pixel comprising a plurality of actual sub-pixels with mutually different colors, the data processing unit comprising:
a first memory for storing illuminance values of the theoretical sub-pixels of each theoretical pixel of a theoretical pixel array of an image to be displayed, the theoretical pixel array of the image to be displayed comprising M rows×N columns of theoretical pixels, wherein N>n, M≥m;
a sub-pixel renderer, which comprises:
the data acquiring module of claim 1, which acquires illuminance values of a×b theoretical sub-pixels corresponding to an actual sub-pixel to be calculated from the first memory, and outputs the acquired illuminance values of the a×b theoretical sub-pixels simultaneously through the data input and output terminal, the first-in first-out memories and each of the shift registers in the shift register groups;
a calculation module, which uses the illuminance value of each theoretical sub-pixel in the illuminance values of the a×b theoretical sub-pixels output by the data acquiring module to calculate an illuminance value of the actual sub-pixel; and
an actual illuminance signal generator, which generates an actual illuminance signal according to the illuminance value of the actual sub-pixel calculated by the calculation module; and
an enable signal generator, which, after receiving a start timing signal, sends an enable signal to the first-in first-out memory of the data acquiring module storing the data, to make the first-in first-out memory to read out the data; and
a second memory for storing the actual illuminance signal generated by the actual illuminance signal generator.

3. The data processing unit of claim 2, wherein the calculation module comprises:
a×b multipliers, which respectively receive the illuminance values of a×b theoretical sub-pixels output by the data acquiring module, and in each of which, the received illuminance value of a theoretical sub-pixel is multiplied with a corresponding filtering coefficient;

an adder, which sums the a×b products acquired by the a×b multipliers; and a conversion module, which converts the sum acquired by the adder into an actual illuminance value of the actual sub-pixel.

4. The data processing unit of claim 2, further comprising:
an edge processor for supplementing with virtual pixels of which the illuminance values of the respective sub-pixels are all 0s at the outside of the first row and the last row as well as at the outside of the first column and the last column of the image to be displayed, to form a virtual pixel array corresponding to the theoretical pixel array of the image to be displayed,
the first memory receiving and storing the illuminance values of the respective sub-pixels of each pixel of the virtual pixel array.

5. The data processing unit of claim 3, wherein a filtering coefficient is the product of an initial coefficient and $2^{16}$, and the sum of all the initial coefficients is 1, and
the conversion module comprises a shift unit for dividing the sum acquired by the adder by $2^{16}$, so as to get an illuminance value of the actual sub-pixel.

6. The data processing unit of claim 5, wherein a=3, b=3, and the filtering coefficients corresponding to the first row of theoretical sub-pixels are 459, 7733, and 0 respectively, the filtering coefficients corresponding to the second row of theoretical sub-pixels are 13631, 31850, and 3670 respectively, and the filtering coefficients corresponding to the third row of theoretical sub-pixels are 459, 7733, and 0 respectively.

7. A driver for driving a pixel array, comprising:
a signal input interface for receiving illuminance values of the theoretical sub-pixels of each theoretical pixel of a theoretical pixel array of an image to be displayed;
the data processing unit of claim 2;
an output interface for outputting the actual illuminance signals stored in the second memory of the data processing unit to the pixel array; and
a timing control unit for controlling data input and output timing of the data acquiring module of the sub-pixel renderer of the data processing unit,
wherein, after the first group of b pieces of data have been transmitted to the data input and output terminal of the data acquiring module, the timing control unit sends a timing start signal each time when a group of b pieces of data are transmitted subsequently, so as to make the enable signal generator of the data processing unit to send an enable signal to the first-in first-out memories of the data acquiring module storing the data, and to make the first-in first-out memories to read out the data, and
after the first (b−1) pieces of data of the $a^{th}$ group of data have been transmitted to the respective shift registers of the $a^{th}$ shift register group of the data acquiring module, the timing control unit sends a timing end signal, to make the data input and output terminal of the data acquiring module, the respective first-in first-out memories and each shift registers in the respective shift register groups to output the data simultaneously.

8. The driver of claim 7, wherein the output interface comprises a mobile industry processor interface, and/or the signal input interface comprises a digital video interface.

9. A display device, comprising a pixel array and the driver for driving a pixel array of claim 7, the pixel array comprising a plurality of pixels, each pixel comprising three sub-pixels of different colors, and the aspect ratio of the sub-pixels is between 2:3 to 1:1.

10. A method for acquiring data by using the data acquiring module of claim 1, comprising:
after a first group of b pieces of data have been transmitted to the data input and output terminal of the data acquiring module, each time when a group of b pieces of data are transmitted in, making the first-in first-out memories of the data acquiring module to read out data; and
after the first (b−1) pieces of data of the $a^{th}$ group of data have been transmitted to the respective shift registers of the $a^{th}$ shift register group of the data acquiring module, making the data input and output terminal of the data acquiring module, the respective first-in first-out memories and each shift register in the respective shift register groups to output data simultaneously.

11. A driver for driving a pixel array, comprising:
a signal input interface for receiving illuminance values of the theoretical sub-pixels of each theoretical pixel of a theoretical pixel array of an image to be displayed;
the data processing unit of claim 3;
an output interface for outputting the actual illuminance signals stored in the second memory of the data processing unit to the pixel array; and
a timing control unit for controlling data input and output timing of the data acquiring module of the sub-pixel renderer of the data processing unit,
wherein, after the first group of b pieces of data have been transmitted to the data input and output terminal of the data acquiring module, the timing control unit sends a timing start signal each time when a group of b pieces of data are transmitted subsequently, so as to make the enable signal generator of the data processing unit to send an enable signal to the first-in first-out memories of the data acquiring module storing the data, and to make the first-in first-out memories to read out the data, and
after the first (b−1) pieces of data of the $a^{th}$ group of data have been transmitted to the respective shift registers of the $a^{th}$ shift register group of the data acquiring module, the timing control unit sends a timing end signal, to make the data input and output terminal of the data acquiring module, the respective first-in first-out memories and each shift registers in the respective shift register groups to output the data simultaneously.

12. A driver for driving a pixel array, comprising:
a signal input interface for receiving illuminance values of the theoretical sub-pixels of each theoretical pixel of a theoretical pixel array of an image to be displayed;
the data processing unit of claim 4;
an output interface for outputting the actual illuminance signals stored in the second memory of the data processing unit to the pixel array; and
a timing control unit for controlling data input and output timing of the data acquiring module of the sub-pixel renderer of the data processing unit,
wherein, after the first group of b pieces of data have been transmitted to the data input and output terminal of the data acquiring module, the timing control unit sends a timing start signal each time when a group of b pieces of data are transmitted subsequently, so as to make the enable signal generator of the data processing unit to send an enable signal to the first-in first-out memories of the data acquiring module storing the data, and to make the first-in first-out memories to read out the data, and after the first (b−1) pieces of data of the $a^{th}$ group of data have been transmitted to the respective shift registers of the $a^{th}$ shift register group of the data acquiring module, the timing control unit sends a timing end signal, to make the data input and output terminal of the data acquiring module, the respective first-in first-out memories and each shift registers in the respective shift register groups to output the data simultaneously.

13. A driver for driving a pixel array, comprising:

a signal input interface for receiving illuminance values of the theoretical sub-pixels of each theoretical pixel of a theoretical pixel array of an image to be displayed;

the data processing unit of claim 5;

an output interface for outputting the actual illuminance signals stored in the second memory of the data processing unit to the pixel array; and a timing control unit for controlling data input and output timing of the data acquiring module of the sub-pixel renderer of the data processing unit, wherein, after the first group of b pieces of data have been transmitted to the data input and output terminal of the data acquiring module, the timing control unit sends a timing start signal each time when a group of b pieces of data are transmitted subsequently, so as to make the enable signal generator of the data processing unit to send an enable signal to the first-in first-out memories of the data acquiring module storing the data, and to make the first-in first-out memories to read out the data, and after the first (b−1) pieces of data of the $a_{th}$ group of data have been transmitted to the respective shift registers of the $a_{th}$ shift register group of the data acquiring module, the timing control unit sends a timing end signal, to make the data input and output terminal of the data acquiring module, the respective first-in first-out memories and each shift registers in the respective shift register groups to output the data simultaneously.

14. A driver for driving a pixel array, comprising:

a signal input interface for receiving illuminance values of the theoretical sub-pixels of each theoretical pixel of a theoretical pixel array of an image to be displayed;

the data processing unit of claim 6;

an output interface for outputting the actual illuminance signals stored in the second memory of the data processing unit to the pixel array; and a timing control unit for controlling data input and output timing of the data acquiring module of the sub-pixel renderer of the data processing unit, wherein, after the first group of b pieces of data have been transmitted to the data input and output terminal of the data acquiring module, the timing control unit sends a timing start signal each time when a group of b pieces of data are transmitted subsequently, so as to make the enable signal generator of the data processing unit to send an enable signal to the first-in first-out memories of the data acquiring module storing the data, and to make the first-in first-out memories to read out the data, and after the first (b−1) pieces of data of the $a_{th}$ group of data have been transmitted to the respective shift registers of the $a_{th}$ shift register group of the data acquiring module, the timing control unit sends a timing end signal, to make the data input and output terminal of the data acquiring module, the respective first-in first-out memories and each shift registers in the respective shift register groups to output the data simultaneously.

15. A display device, comprising a pixel array and the driver for driving a pixel array of claim 8, the pixel array comprising a plurality of pixels, each pixel comprising three sub-pixels of different colors, and the aspect ratio of the sub-pixels is between 2:3 to 1:1.

16. A display device, comprising a pixel array and the driver for driving a pixel array of claim 11, the pixel array comprising a plurality of pixels, each pixel comprising three sub-pixels of different colors, and the aspect ratio of the sub-pixels is between 2:3 to 1:1.

17. A display device, comprising a pixel array and the driver for driving a pixel array of claim 12, the pixel array comprising a plurality of pixels, each pixel comprising three sub-pixels of different colors, and the aspect ratio of the sub-pixels is between 2:3 to 1:1.

18. A display device, comprising a pixel array and the driver for driving a pixel array of claim 13, the pixel array comprising a plurality of pixels, each pixel comprising three sub-pixels of different colors, and the aspect ratio of the sub-pixels is between 2:3 to 1:1.

19. A display device, comprising a pixel array and the driver for driving a pixel array of claim 14, the pixel array comprising a plurality of pixels, each pixel comprising three sub-pixels of different colors, and the aspect ratio of the sub-pixels is between 2:3 to 1:1.

* * * * *